(12) United States Patent
Chen et al.

(10) Patent No.: US 10,663,870 B2
(45) Date of Patent: May 26, 2020

(54) GAUGE PATTERN SELECTION

(71) Applicant: ASML NETHERLANDS B.V., Veldhoven (NL)

(72) Inventors: Jun Chen, San Jose, CA (US); Thomas I. Wallow, San Carlos, CA (US); Bart Laenens, San Jose, CA (US); Yi-Hsing Peng, Fremont, CA (US)

(73) Assignee: ASML NETHERLANDS B.V., Veldhoven (NL)

( * ) Notice: Subject to any disclaimer, the term of this patent is extended or adjusted under 35 U.S.C. 154(b) by 53 days.

(21) Appl. No.: 16/061,016

(22) PCT Filed: Nov. 30, 2016

(86) PCT No.: PCT/EP2016/079336
§ 371 (c)(1),
(2) Date: Jun. 11, 2018

(87) PCT Pub. No.: WO2017/102336
PCT Pub. Date: Jun. 22, 2017

(65) Prior Publication Data
US 2018/0364589 A1  Dec. 20, 2018

Related U.S. Application Data

(60) Provisional application No. 62/269,845, filed on Dec. 18, 2015.

(51) Int. Cl.
*G03F 7/20* (2006.01)
(52) U.S. Cl.
CPC .......... *G03F 7/70625* (2013.01); *G03F 7/705* (2013.01)

(58) Field of Classification Search
CPC ............................. G03F 7/70625; G03F 7/705
See application file for complete search history.

(56) References Cited

U.S. PATENT DOCUMENTS

| | | | |
|---|---|---|---|
| 6,706,456 B2* | 3/2004 | Miyashita | G03F 7/70058 430/30 |
| 7,149,998 B2* | 12/2006 | Li | G03F 1/68 716/53 |
| 7,587,704 B2 | 9/2009 | Ye et al. | |
| 7,695,876 B2* | 4/2010 | Ye | G03F 1/44 382/145 |
| 7,765,021 B2* | 7/2010 | Mansfield | G03F 1/36 382/169 |

(Continued)

OTHER PUBLICATIONS

International Search Report dated Mar. 8, 2017 issued in corresponding International Application No. PCT/EP2016/079336.

*Primary Examiner* — Naum Levin
(74) *Attorney, Agent, or Firm* — Pillsbury Winthrop Shaw Pittman, LLP

(57) ABSTRACT

A method including obtaining a plurality of gauges of a plurality of gauge patterns for a patterning process, each gauge pattern configured for measurement of a parameter of the patterning process when created as part of the patterning process, and creating a selection of one or more gauges from the plurality of gauges, wherein a gauge is included in the selection provided the gauge and all the other gauges, if any, of the same gauge pattern, or all of the one or more gauges of the same gauge pattern linked to the gauge, pass a gauge printability check.

21 Claims, 9 Drawing Sheets

(56) References Cited

U.S. PATENT DOCUMENTS

| | | | |
|---|---|---|---|
| 8,121,387 B2 * | 2/2012 | Asano | G03F 1/86 |
| | | | 382/141 |
| 8,364,452 B2 * | 1/2013 | Mitsuhashi | G03F 1/36 |
| | | | 703/6 |
| 8,381,138 B2 * | 2/2013 | Matsunawa | G03F 7/705 |
| | | | 716/51 |
| 8,694,928 B2 * | 4/2014 | Cao | G03F 1/14 |
| | | | 716/54 |
| 8,739,076 B2 * | 5/2014 | Isoyan | G06F 17/50 |
| | | | 716/51 |
| 8,887,105 B1 * | 11/2014 | Bruguier | G03F 1/70 |
| | | | 716/50 |
| 8,918,742 B2 * | 12/2014 | Feng | G03F 7/706 |
| | | | 716/51 |
| 8,930,172 B2 * | 1/2015 | Ye | G03F 1/14 |
| | | | 703/6 |
| 9,588,439 B1 * | 3/2017 | Bruguier | G03F 7/70625 |
| 10,066,936 B2 * | 9/2018 | Turovets | G01N 21/4788 |
| 2006/0190875 A1 * | 8/2006 | Arisawa | G03F 1/84 |
| | | | 716/52 |
| 2007/0006116 A1 | 1/2007 | Percin et al. | |
| 2009/0100389 A1 | 4/2009 | Kusnadi et al. | |
| 2009/0319829 A1 * | 12/2009 | Takayama | G06F 11/263 |
| | | | 714/32 |
| 2010/0122225 A1 * | 5/2010 | Cao | G03F 1/14 |
| | | | 716/136 |
| 2010/0166289 A1 * | 7/2010 | Satake | G03F 1/44 |
| | | | 382/144 |
| 2010/0171036 A1 | 7/2010 | Abdo | |
| 2011/0224956 A1 | 9/2011 | Ye et al. | |
| 2011/0283244 A1 | 11/2011 | Abdo et al. | |
| 2013/0014065 A1 | 1/2013 | Feng et al. | |
| 2015/0185625 A1 | 7/2015 | Chen et al. | |
| 2015/0186557 A1 | 7/2015 | Ye et al. | |

\* cited by examiner

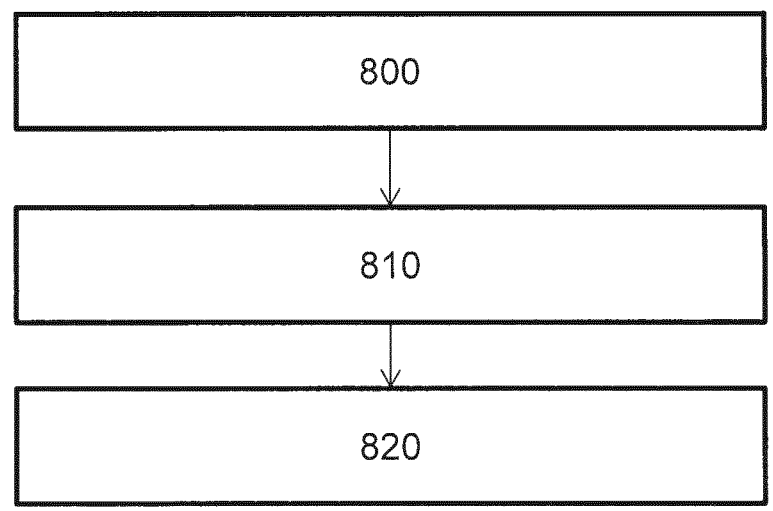
Fig. 8
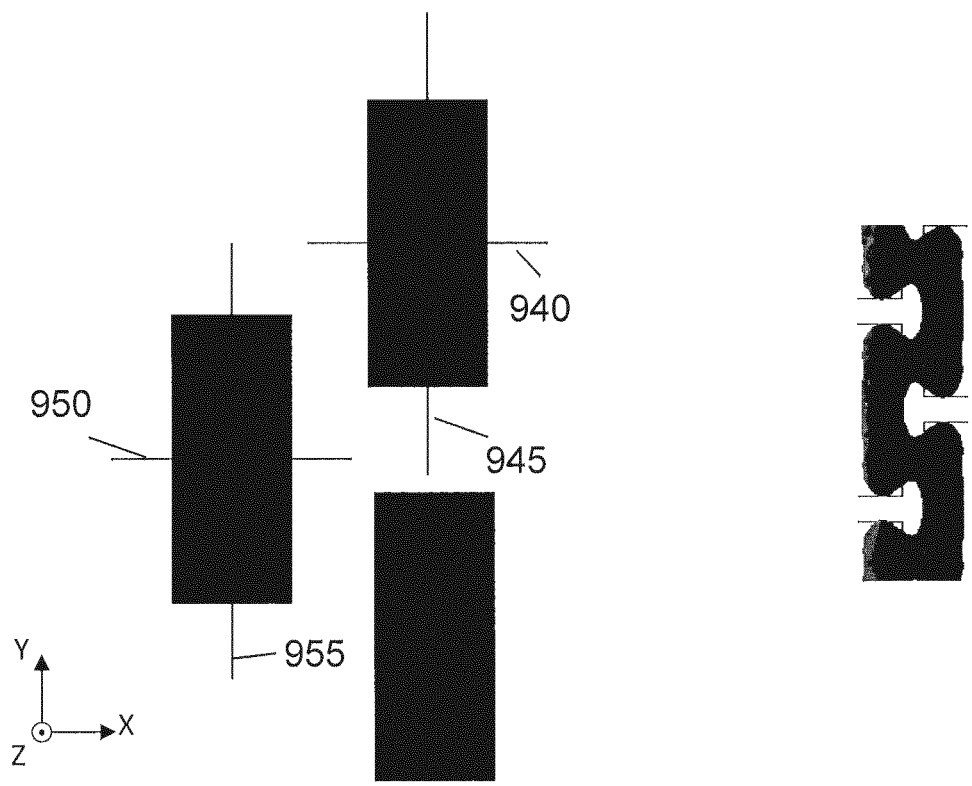
Fig. 9A                    Fig. 9B

GAUGE PATTERN SELECTION

CROSS-REFERENCE TO RELATED APPLICATIONS

This application is the U.S. national phase entry of PCT patent application no. PCT/EP2016/079336, which was filed on Nov. 30, 2016, which claims the benefit of priority of U.S. provisional application No. 62/269,845, which was filed on Dec. 18, 2015 and which is incorporated herein in its entirety by reference.

FIELD

The present description relates to methods and apparatus for improved pattern selection for model calibration.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

In a patterning process (i.e., a process of creating a device or other structure involving patterning (such as lithographic exposure or imprint), which may typically include one or more associated processing steps such as development of resist, etching, etc.), it is desirable to create one or more models that model one or more aspects of the patterning process. Such one or more models may include one or more models that convert a designed pattern into its form(s) during the patterning process, analyze one or more distortions arising during the patterning process, and correct the pattern in order to compensate for the one or more distortions. Distortion may arise from optics, patterning material, a substrate property, a process characteristic, etching, among others.

Models of various types (such as optical proximity correction (OPC) models) are calibrated and verified using different kinds of pattern structures. Doing so involves measurement of structures created with the patterning process. One or more parameters of those measured structures are typically measured or determined, for example the critical dimension (CD) of a structure, the overlay error between successive layers formed in or on the substrate, etc. There are various techniques for making measurements of the small structures formed in a patterning process. Various tools for making such measurements are known including, but not limited to, scanning electron microscopes (SEMs), which are often used to measure CD. SEMs have high resolving power and are capable of resolving features with sub-nanometer precision.

Additionally, it is desirable to make measurements of structures created with the patterning process and use them for design, control and/or monitoring relating to the patterning process, e.g., for process design, control and/or verification. The information contained in images (e.g., SEM images) of patterned structures can be used for patterning process design, correction and/or verification, defect detection or classification, yield estimation and/or process control. Such images may be processed to extract contours that describe the edges of objects, representing, e.g., device or measurement structures, in the image. These contours are then quantified via metrics, such as CD. Thus, typically, the images of structures are compared and quantified via metrics, such as an edge-to-edge distance or simple pixel differences between images.

Accordingly, it is desirable to provide, for example, a method and apparatus to obtain improved geometric dimensions and/or contours to calibrate one or more patterning process models and/or for patterning process design, control and/or monitoring.

In an embodiment, there is provided a method comprising: obtaining a plurality of gauges of a plurality of gauge patterns for a patterning process, each gauge pattern configured for measurement of a parameter of the patterning process when created as part of the patterning process; and creating a selection of one or more gauges from the plurality of gauges, wherein a gauge is included in the selection provided the gauge and all the other gauges, if any, of the same gauge pattern, or all of the one or more gauges of the same gauge pattern linked to the gauge, pass a gauge printability check.

In an embodiment, there is provided a method comprising: obtaining a plurality of gauges of a plurality of gauge patterns for a patterning process, each gauge pattern configured for measurement of a parameter of the patterning process when created as part of the patterning process; and creating a selection of one or more gauges from the plurality of gauges, wherein a gauge is included in the selection provided that its gauge pattern is considered to be printed well based on evaluation of the printability of the gauge pattern.

In an embodiment, there is provided a method comprising: obtaining a plurality of gauges of one or more gauge patterns for a patterning process, the one or more gauge patterns each configured for measurement of a parameter of the patterning process when created as part of the patterning process; and creating a selection of one or more gauges from the plurality of gauges, wherein a gauge is included in the selection provided that it is metrology friendly responsive to evaluation of the gauge pattern of the gauge against a predetermined shape for which a measurement algorithm of an inspection tool is designed to measure.

In an embodiment, there is provided a method of manufacturing devices wherein a device pattern is applied to a series of substrates using a patterning process, the method including performing a method as described herein and controlling and/or designing the patterning process for one or more of the substrates in accordance with the one or more gauges of the method.

In an embodiment, there is provided a non-transitory computer program product comprising machine-readable instructions configured to cause a processor to cause performance of a method as described herein.

In an embodiment, there is provided a system comprising: a scanning electron microscope configured to provide an image of a patterning process created structure; and an image analysis engine comprising a non-transitory computer program product as described herein. In an embodiment, the system further comprises a lithographic apparatus comprising a support structure configured to hold a patterning device to modulate a radiation beam and a projection optical system arranged to project the modulated onto a radiation-sensitive substrate.

BRIEF DESCRIPTION OF THE DRAWINGS

Embodiments will now be described, by way of example only, with reference to the accompanying drawings in which:

FIG. 8 is a flow diagram illustrating an embodiment of a method of gauge selection;

FIG. 9A schematically depicts an example of a plurality of adjacent gauge patterns;

FIG. 9B schematically depicts an example of how the contours of adjacent gauge patterns in FIG. 9A can become joined together;

DETAILED DESCRIPTION

Before describing embodiments in detail, it is instructive to present an example environment in which embodiments may be implemented.

Figure 1:
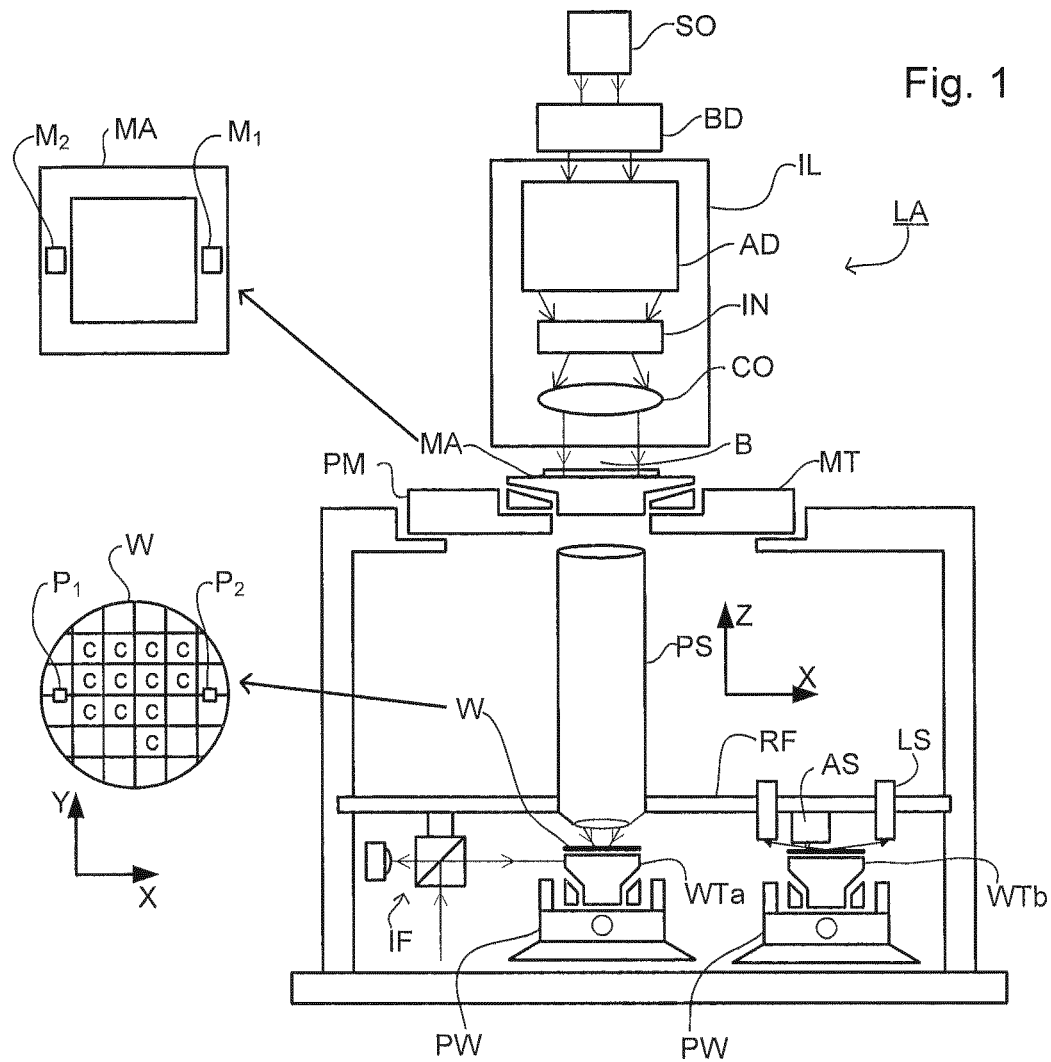
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive or reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for pattern transfer.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—a pattern transfer station and a measurement station—between which the tables can be exchanged. For example, while a substrate on one table is having a pattern transferred thereto at the pattern transfer station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the pattern transfer station, a second position sensor may be provided to enable the positions of the table to be tracked at both stations. As another example, while a substrate on one table has a pattern transferred thereto at the pattern transfer station, another table without a substrate waits at the measurement station (where optionally measurement activity may occur). This other table has one or more measurement devices and may optionally have other tools (e.g., cleaning apparatus). When the substrate has completed pattern transfer thereto, the table without a substrate moves to the pattern transfer station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
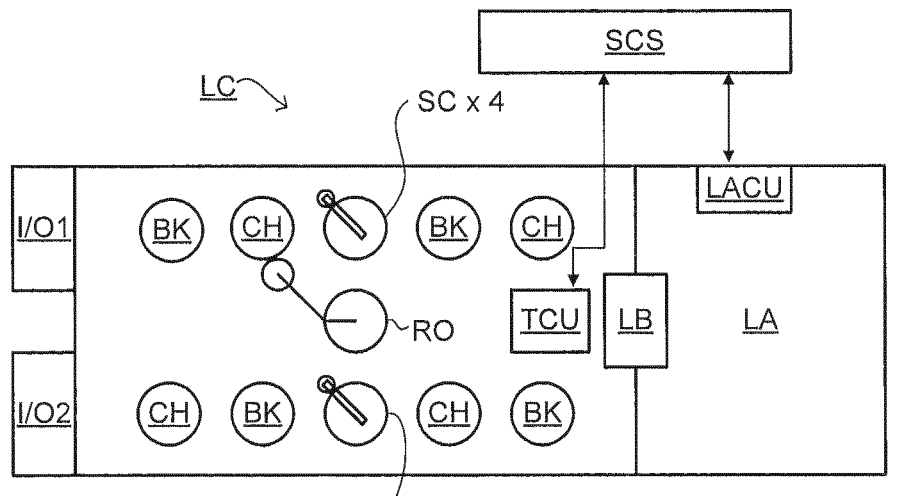
FIG. 2 schematically depicts an embodiment of a lithographic cell or cluster.

As shown in FIG. 2, the lithographic apparatus LA may form part of a lithographic cell LC, also sometimes referred to as a lithocell or lithocluster, which also includes apparatus to perform one or more pre- and post-pattern transfer processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

It is desirable to inspect a patterned substrate to measure one or more properties such as overlay error between subsequent layers, line thickness, critical dimension (CD), etc. If an error is detected, an adjustment may be made to, for example, patterning of one or more subsequent substrates. This may particularly useful, for example, if the inspection can be done soon and fast enough that another substrate of the same batch is still to be patterned. Also, an already patterned substrate may be stripped and reworked (to improve yield) or discarded, thereby avoiding performing patterning on a substrate that is known to be faulty. In a case where only some target portions of a substrate are faulty, further patterning may be performed only on those target portions which are good. Another possibility is to adapt a setting of a subsequent process step to compensate for the error, e.g. the time of a trim etch step can be adjusted to compensate for substrate-to-substrate CD variation resulting from a lithographic process step. As discussed further below, measurements may be used in the patterning process design (e.g., in designing the device design).

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the resist layer immediately after patterning. In an embodiment, the measurement may be taken of a latent image in exposed resist. But, the latent image in the resist has a very low contrast—there is only a very small difference in refractive index between the part of the resist which has been exposed to radiation and that which has not. So, measurements may be taken after the post-exposure bake step (PEB) which is customarily the first step carried out on an exposed substrate and increases the contrast between exposed and unexposed parts of the resist. At this stage, the image in the resist may be referred to as semi-latent. Further, in an embodiment and commonly, measurements may be made of the developed resist image—at which point either the exposed or unexposed parts of the resist have been removed—or after a pattern transfer step such as etching. Measuring after etching limits the possibility for rework of a faulty substrate but may still provide useful information, e.g. for the purpose of process control.

Figure 3:
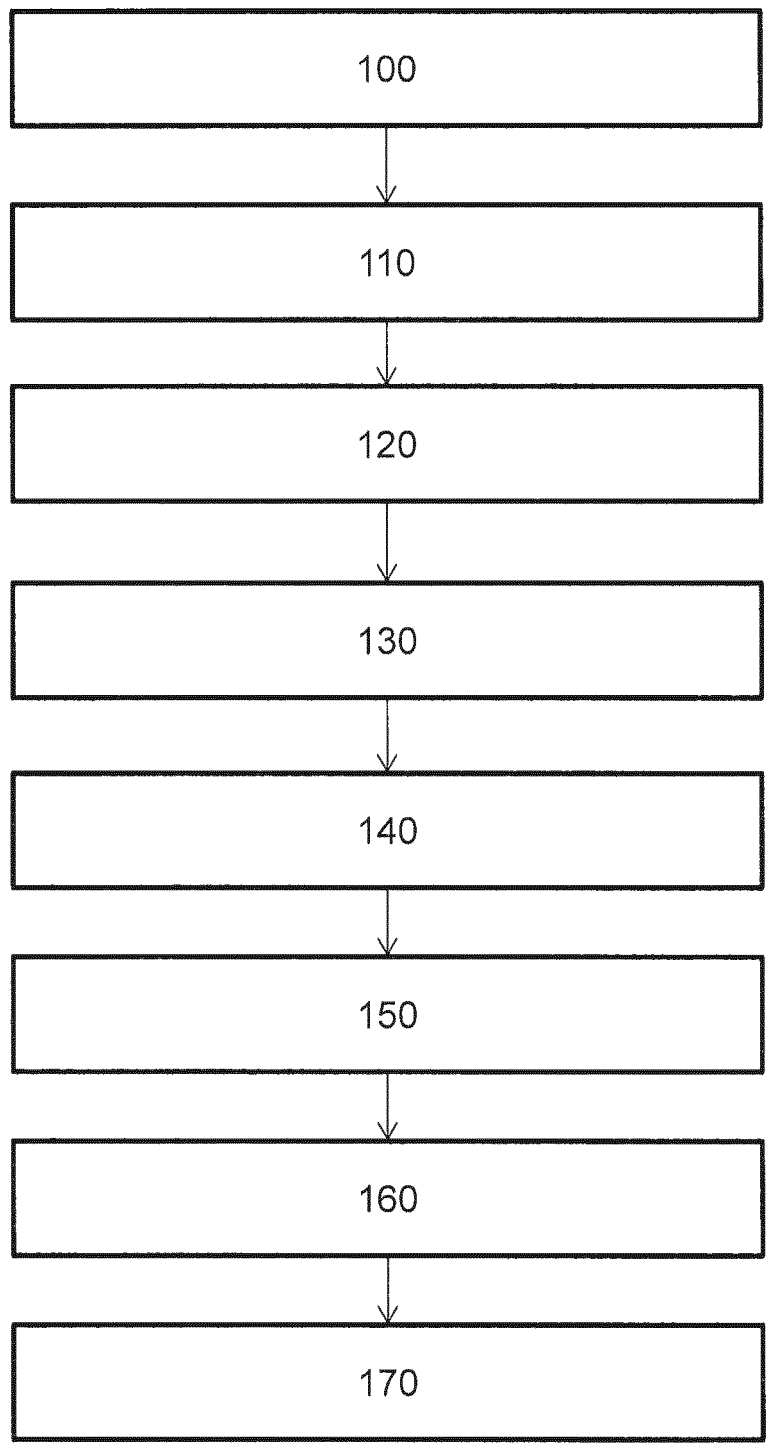
FIG. 3 schematically depicts an embodiment of a system to design a patterning process.

As noted above, one or more aspects of the patterning process need to be designed. To do this, there may be provided one or more tools used in computationally designing those one or more aspects, such as the pattern design for a patterning device (including, for example, adding sub-resolution assist features or optical proximity corrections), the illumination for the patterning device, etc. Accordingly, in a system for computationally designing a manufacturing process involving patterning, the major manufacturing system components and/or processes can be described by various functional modules, for example, as illustrated in FIG. 3. Referring to FIG. 3, the functional modules may include a design layout module 100, which defines a device design (e.g., integrated circuit, memory or electronic device) pattern; a patterning device layout module 110, which defines how the patterning device pattern is laid out in polygons based on the device design; a patterning device model module 120, which models the physical properties of the pixilated and continuous-tone patterning device to be utilized during the simulation process; a pattern transfer (e.g., an optical) model module 130, which defines the performance of the components that transfer the pattern from the patterning device to the substrate, such as an optical lithography system; a resist model module 140, which defines the performance of the resist being utilized in the given process; a process model module 150, which defines performance of the post-resist development processes (e.g., etch); and a metrology module 160, which defines the performance of a metrology system used with a metrology target and thus the performance of the metrology target when used with the metrology system. The results of one or more of the simulation modules, for example, predicted contours and CDs, are provided in a result module 170.

The properties of the pattern transfer device, such as illumination and projection optics, are captured in the pattern transfer model module 130. Where the pattern transfer is by, e.g., optical lithography, the properties can include, but are not limited to, numerical aperture, sigma ($\sigma$) settings as well as any particular illumination source shape, where $\sigma$ (or sigma) is outer radial extent of the illuminator. The optical properties of the photo-resist layer—e.g., refractive index, film thickness, propagation and/or polarization effects— may also be captured as part of the model module 130, whereas the resist model module 140 describes the effects of chemical processes which occur during pattern transfer to the resist, post pattern transfer bake (sometimes referred to as post exposure bake (PEB)) and development, in order to predict, for example, contours of resist features formed on the substrate. The patterning device model module 120 captures how the design features are laid out in the pattern of the patterning device and may include a representation of detailed physical properties of the patterning device, as described, for example, in U.S. Pat. No. 7,587,704.

The objective of the simulation is to accurately predict, for example, edge placements and CDs, which can then be compared against the device design. The device design is generally defined as the pre-OPC patterning device layout, and will be provided in a standardized digital file format such as GDSII or OASIS.

In general, where the pattern transfer is by, e.g., optical lithography, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of incident energy, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

To enable, for example, calibration of a computational model and/or for patterning process design, control and/or monitoring, it is desirable to take various measurements of patterns printed on a substrate using an inspection apparatus. In some embodiments, the inspection apparatus may be a scanning electron microscope (SEM) that yields an image of one or more structures (e.g., one or more test (or calibration) patterns or one or more patterns corresponding to some or all the structures of a device) transferred on the substrate.

Figure 4:
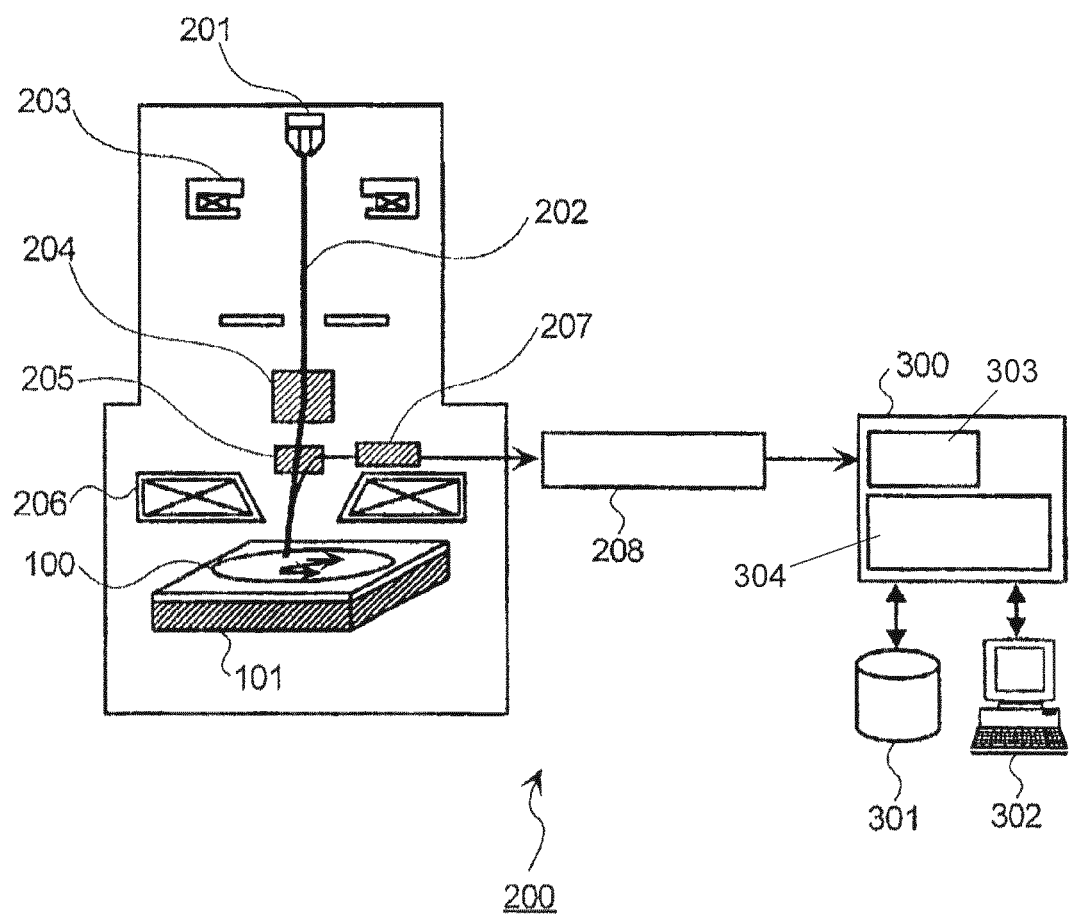
FIG. 4 schematically depicts an embodiment of a scanning electron microscope (SEM)

FIG. 4 depicts an embodiment of a SEM 200. A primary electron beam 202 emitted from an electron source 201 is converged by condenser lens 203 and then passes through a beam deflector 204, an ExB deflector 205, and an objective lens 206 to irradiate a substrate 100 on a substrate table 101 at a focus.

When the substrate 100 is irradiated with electron beam 202, secondary electrons are generated from the substrate 100. The secondary electrons are deflected by the ExB deflector 205 and detected by a secondary electron detector 207. A two-dimensional electron beam image can be obtained by detecting the electrons generated from the sample in synchronization with, e.g., two dimensional scanning of the electron beam by beam deflector 204 or with repetitive scanning of electron beam 202 by beam deflector 204 in an X or Y direction, together with continuous movement of the substrate 100 by the substrate table 101 in the other of the X or Y direction.

A signal detected by secondary electron detector 207 is converted to a digital signal by an analog/digital (A/D) converter 208, and the digital signal is sent to an image processing system 300. In an embodiment, the image processing system 300 may have memory 303 to store all or part of digital images for processing by a processing unit 304. The processing unit 304 (e.g., specially designed hardware or a combination of hardware and software) is configured to convert or process the digital images into datasets representative of the digital images. Further, image processing system 300 may have a storage medium 301 configured to store the digital images and corresponding datasets in a reference database. A display device 302 may be connected with the image processing system 300, so that an operator can conduct necessary operation of the equipment with the help of a graphical user interface.

Returning back to designing, controlling or monitoring a patterning process, sophisticated fine-tuning steps may be applied to patterning process apparatus and/or to the patterning device design at the outset of the patterning process, during the execution of the patterning process, or for later use of the patterning process. Where the pattern transfer is by, e.g., optical lithography, these include, for example, but not limited to, optimization of numerical aperture, optimization of coherence settings, customized illumination schemes, use of phase shifting features in or on a patterning device, optical proximity correction in the patterning device layout, placement of sub-resolution assist features in the patterning device layout or other methods generally defined as "resolution enhancement techniques" (RET).

As an example, optical proximity correction (OPC) addresses the fact that the final size and placement of a printed feature on the substrate will not simply be a function of the size and placement of the corresponding feature on the patterning device. For the small feature sizes and high feature densities present on typical circuit designs, the position of a particular edge of a given feature will be influenced to a certain extent by the presence or absence of other adjacent features. In an embodiment, these proximity effects arise from, e.g., coupling of radiation from more than one feature. In an embodiment, proximity effects arise from diffusion and other chemical effects during post-pattern transfer bake, resist development, and etching that generally follow pattern transfer.

In order to help ensure that the features are generated on a substrate in accordance with the requirements of the given device design, proximity effects should be predicted utilizing sophisticated numerical models, and corrections or pre-distortions are applied to the design of the patterning device before successful manufacturing of devices becomes possible. These modifications may include shifting or biasing of edge positions or line widths and/or application of one or more assist features that are not intended to print themselves, but will affect the properties of an associated primary feature.

The application of a model-based patterning process design requires good process models and considerable computational resources, given the many millions of features typically present in a chip design. However, applying model-based design is generally not an exact science, but an iterative process that does not always resolve all possible weaknesses of a device design. Therefore, post-OPC designs, i.e. patterning device layouts after application of all pattern modifications by OPC and any other RET's, should be verified by design inspection, e.g., intensive full-chip simulation using calibrated numerical process models, in order to reduce the possibility of design flaws being built into the manufacturing of a patterning device.

Moreover, since computational patterning process design should involve robust models that describe the patterning process precisely, a calibration procedure for such models should be used to achieve models that are valid, robust and accurate across the process window. In an embodiment, calibration is done by printing a certain number of 1-dimensional and/or 2-dimensional gauge patterns on a substrate (e.g., the gauge patterns may be specially designated measurement patterns or may be device parts of a design device pattern as printed on the substrate) and performing measurements on the printed patterns. More specifically, those 1-dimensional gauge patterns are line-space patterns with varying pitch and CD, and the 2-dimensional gauge patterns typically include line-ends, contacts, vias, and/or SRAM (Static Random Access Memory) patterns. These patterns are then transferred onto a substrate and resulting substrate CDs or contact hole (also known as a via or through-chip via) energy are measured. The original gauge patterns and their substrate measurements are then used jointly to determine the model parameters which reduce or minimize the difference between model predictions and substrate measurements. In an embodiment, the one or more gauge or calibration patterns may not correspond to structures in a device. But, the one or more gauge or calibration patterns possess enough similarities with one or more patterns in the device to allow accurate prediction of the one or more device patterns.

Figure 5:
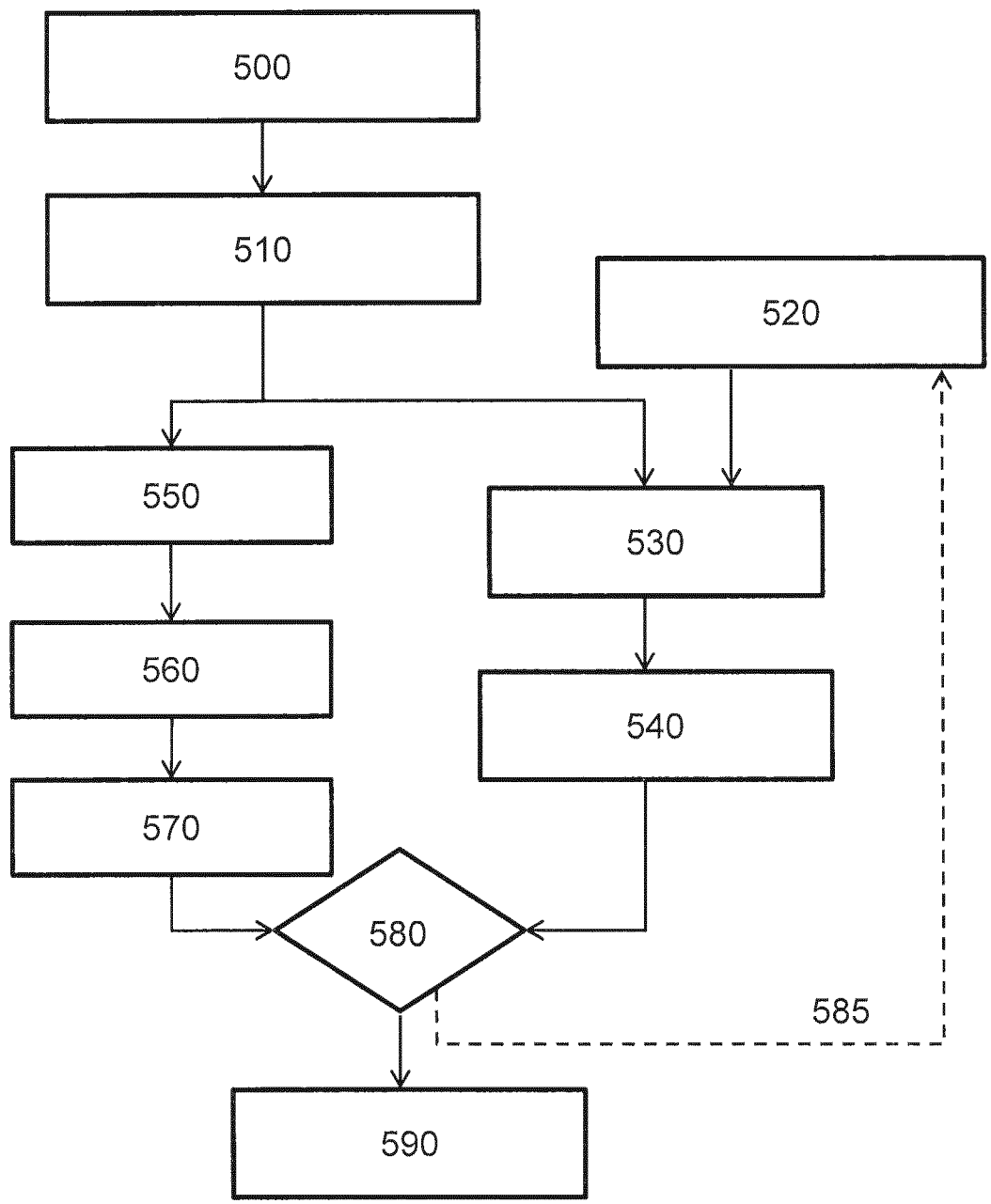
FIG. 5 is a flow diagram illustrating an example calibration process for a patterning process model.

An example model calibration process as described above is illustrated in FIG. 5. The process begins with a design layout 500, which can include gauges and optionally other test patterns, and which design layout may include OPC or other RET features. Next, the design layout is used to generate a patterning device layout at 510, which can be in a standard format such as GDSII or OASIS. Then, in an embodiment, two separate paths are taken, for simulation and measurement.

In a simulation path, the patterning device layout and a model 520 are used to create a simulated resist pattern in step 530. The model 520 provides a model of the patterning process for use in computing how the patterning process behaves, and the calibration process aims to make the model 520 as accurate as possible, so that computed results are likewise accurate. The simulated resist pattern is then used to determine predicted CDs, contours, etc. at step 540.

In a measurement path, the patterning device layout 304 is used with, or to form, a physical mask (e.g., a reticle) at 550, which is then used to pattern a substrate at 560. The patterning process (e.g. NA, focus, dose, illumination source, etc. for optical lithography) used to pattern the substrate is the same as that intended to be captured in model 520. Measurements (e.g. using an inspection tool (such as a SEM, etc.) are then performed on the actual patterned substrate at 570 using the gauge patterns described herein (that are also produced using the patterning process), which yields measured CDs, contours, etc.

A comparison is made at 580 between the measurements from 570 and the predictions from 540. If the comparison determines that the predictions match the measurements within a predetermined error threshold, the model is considered to be successfully calibrated at 590. Otherwise, changes are made to the model 520 at step 585. Steps 530, 540 and 570 are repeated until the predictions generated using the model 520 match the measurements within the predetermined threshold. In an embodiment, the model comprises an OPC model. While the description hereafter will focus on an OPC model as an embodiment, the model may be other than or in addition to an OPC model.

Further, after successful calibration, the model may be utilized to predict patterns to be produced on a substrate using, for example, a new patterning device. By comparing the predicted patterns and the physical pattern produced in the substrate using the new patterning device, errors in the new patterning device (e.g., a defect in manufacturing the new patterning device) and/or a failure in the patterning process apparatus (e.g., when a lens has aberrations or another tool error occurs) may be captured. In an embodiment, a monitoring process is started by employing the calibrated model to simulate a resist pattern using the new patterning device. In an embodiment, a certain number of 1-dimensional and/or 2-dimensional gauge patterns are printed on a substrate using, e.g., a lithographic imaging system, and are later measured using an inspection tool (e.g., a CD-SEM). The measurements of the gauge patterns and the simulated resist pattern are then used jointly to determine whether the new patterning device and/or apparatus in the patterning process are functioning properly.

Figure 6:
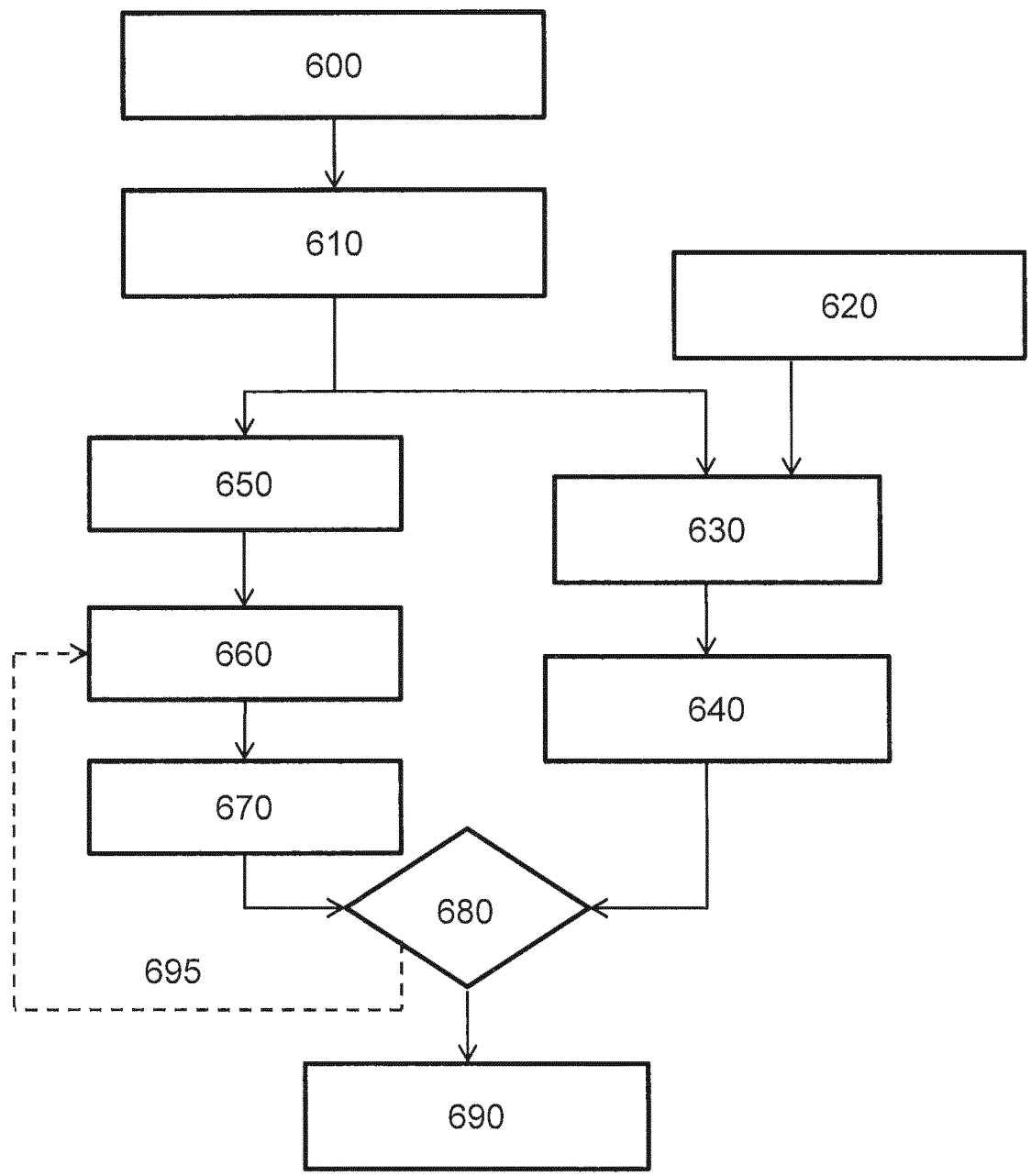
FIG. 6 is a flow diagram illustrating an example patterning quality monitoring process.

FIG. 6 illustrates an example monitoring process, using the calibrated model as described above or another model, using one or more gauge or other test patterns. The process begins with a design layout 600, which can include gauges and optionally other test patterns. Next, the design layout 600 is used to generate a patterning device layout at 610, which can be in a standard format such as GDSII or OASIS. Then in an embodiment, two separate paths are taken, for simulation and measurement.

In a simulation path, a model 620 is used to create a simulated resist pattern in step 630. The simulated resist pattern is used to determine predicted CDs, contours, etc. of a certain number of 1-dimensional and/or 2-dimensional gauge patterns at 640.

In a measurement path, the patterning device layout from 610 is used to form, or with, a patterning device at 650, which is then used to pattern a substrate at 660 using a patterning process. The patterning process to pattern the substrate is the same as that intended to be captured in the model 620. Measurements (e.g., using an inspection tool (such as a CD-SEM)) are then performed on the actual patterned substrate at 670 to yield measured CDs, contours, etc. The measurements at 670 measure gauges of at least a subset of gauge patterns on the substrate, corresponding to simulated gauge patterns at 640.

A comparison is made at 680 between the measurements from 670 and the predictions from 640. If the comparison determines that the measurements match the predictions within a predetermined error threshold, both the patterning device and the patterning process are considered to be operating properly at 690. Otherwise, at 695, an alert may be generated of an error in the patterning process, feedback may be generated to alter the patterning process, the patterning device, the patterning device layout, etc. Steps 660 and 670 are repeated until the measurements match the predictions made by the model 620 within the predetermined error threshold.

Accordingly, it is desirable to provide, for example, a method and apparatus to obtain improved geometric dimensions and/or contours to calibrate or verify one or more patterning process models and/or for patterning process design, control and/or monitoring. For example, it is desirable to provide, for example, a method and apparatus to select one or more gauge patterns and/or obtain improved geometric dimensions and/or contours from one or more gauge patterns, in order to calibrate or verify one or more patterning process models and/or for patterning process design, control and/or monitoring.

Figure 7A:
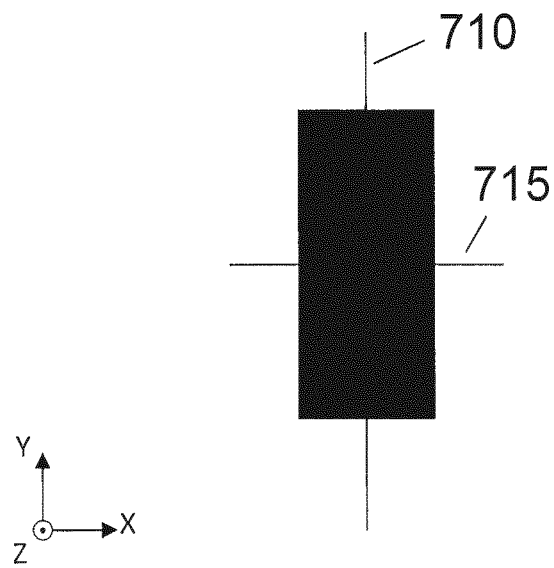
FIGS. 7A-B schematically depict two example gauge patterns with example gauges shown.
Figure 7B:
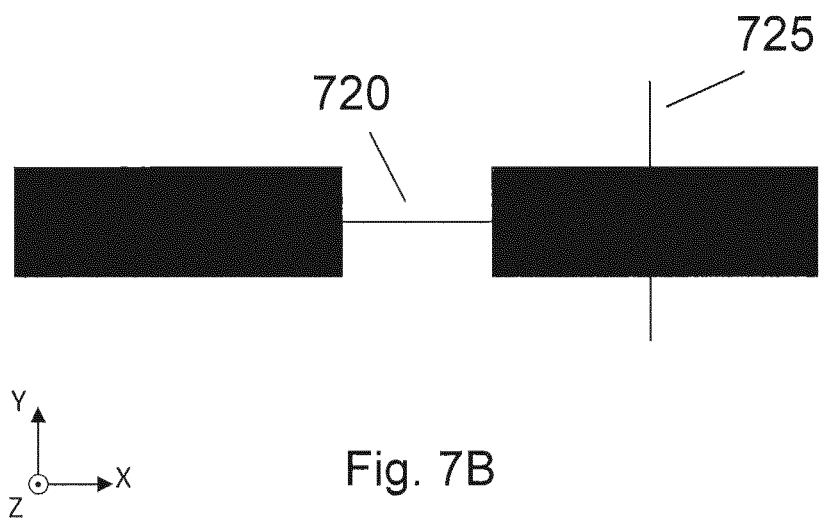

Referring now to FIG. 7, schematics of two example gauge patterns are depicted for two-dimensional metrology. FIG. 7A illustrates a rectangular gauge pattern. Gauges correspond to imaginary lines that intersect the contour of the shape(s) that is measured and, more specifically, the gauges are the points where the imaginary lines respectively intersect the shape(s) such that the applicable geometric dimensions can be determined. For example, in FIG. 7A, example gauges correspond to the imaginary lines 710, 715 that are superimposed on the contour of the shape depicted therein, i.e., the gauge 710 for CD in the Y-direction and the gauge 715 for CD in the X direction. The gauges are determined at the points where the imaginary lines respectively intersect the shape such that the applicable geometric dimensions can be determined. FIG. 7B illustrates another example gauge pattern including two rectangular parts. In this case, example gauges correspond to the imaginary lines 720, 725, i.e., the gauge 720 for CD between the two rectangular parts in the X direction and the gauge 725 for CD of either rectangular part in the Y direction. Again, the gauges are determined at the points where the imaginary lines respectively intersect the shape(s) such that the applicable geometric dimensions can be determined. Although only two gauges are shown in FIG. 7A and FIG. 7B, the number of gauges may be fewer or more than shown, typically much more than shown. Similarly, the gauges may be in different directions, between different shape parts, etc. For each gauge pattern or more likely a plurality of gauge patterns, there may be tens, hundreds, thousands if not millions, of actual or possible gauges.

Accordingly, it is desirable, for example, to identify a selection of gauges from a potentially enormous pool of gauges for measurement or evaluation from measurement results. This may include evaluation of gauge patterns themselves to rule out one or more gauge patterns from gauge evaluation from measurement results and/or for gauge measurement.

In an embodiment, an initial model (e.g., optical model and resist model) may be used to perform a check of printability of each gauge of a pool of gauges. That is, in an embodiment, the gauge is determined by simulation using a mathematical model of at least part of the patterning process. The gauges may be checked against one or more parameters that identify whether a gauge is printable or not. For example, the model may be employed to predict the CD for each gauge (e.g., the gauges 710, 715, 720, and 725) of the pool. In an embodiment, the model evaluates the points where the imaginary lines intersect the gauge pattern shapes to improve the computation time. When a predicted CD of a gauge crosses a corresponding CD threshold (e.g., greater than or equal to the nominal CD (e.g., 30 nm)), the gauge is considered to pass and then considered further (e.g., for further evaluation before it is used, for gauge evaluation from measurements and/or the gauge (or its gauge pattern) is measured). Alternatively, when a predicted CD of a gauge crosses a corresponding CD threshold (e.g., less than the nominal CD (e.g., 30 nm)), the gauge is considered to fail and then not considered further (e.g., not for gauge evaluation from measurements and/or the gauge (or its gauge pattern) is not measured). The CDs of different gauges may correspond to different CD thresholds. This process may be referred to as a CD check for a gauge.

In addition or alternatively, image log slope (ILS) may be used to characterize a gauge (e.g., the gauges 710, 715, 720, and 725). Specifically, the ILS for a gauge identifies the contrast of the gauge and may be calculated based on an image of the gauge pattern. A small ILS indicates a relatively blurry gauge which makes it difficult to accurately measure the CD that the blurry gauge represents. Accordingly, a large ILS indicates a clearer gauge which makes it possible to accurately measure the CD that the clear gauge represents. In an embodiment, the model evaluates the points where the imaginary lines intersect the gauge pattern shapes to improve the computation time. So, in an embodiment, when a predicted ILS of a gauge crosses a corresponding ILS threshold (e.g., a value above which the ILS is sufficient), the gauge is considered to pass and then considered further (e.g., for further evaluation before it is used, for gauge evaluation from measurements and/or the gauge (or its gauge pattern) is measured). Alternatively, when a predicted ILS of a gauge crosses a corresponding ILS threshold (e.g., a value below which the ILS is too low), the gauge is considered to fail and then not considered further (e.g., not for gauge evaluation from measurements and/or the gauge (or its gauge pattern) is not measured). This process may be referred to as an ILS check for a gauge.

CD and ILS are not the only possible parameters; one or more other parameters may be used. In an embodiment, a plurality of parameters is evaluated; the plurality of parameters may include CD and/or ILS. The CD check, ILS check and/or other check of a parameter relating to the gauge for printability may be referred to as a gauge printability check.

So, in an embodiment, all the gauges which pass the gauge printability check are considered for further use. Thus, the gauges that do not pass the gauge printability check are not measured (e.g., just the gauges are not measured or the gauge pattern as a whole is not measured) or not evaluated from measurements. In an embodiment, the gauge pools may have hundreds of thousands, if not millions, of possible gauges. The gauge printability check can select for 50,000-700,000.

After the gauge printability check, one or more gauges of the remaining gauges are selected for gauge evaluation from measurement results and/or for gauge measurement, based on sensitivity to a physical, chemical or optical parameter of the patterning process (including without limitation pertaining to any of its apparatus or working material), such as resist sensitivity and/or optical sensitivity. In an embodiment, the sensitivity is determined using a mathematical model of at least part of the patterning process. In an embodiment, the sensitivity may be determined by perturbing the model to identify a change in gauge signal, such as CD, intensity, etc. The gauges with the most sensitivity to perturbation are then selected. The one or more selected gauges form a selected gauge pool, where one or more of the gauges from the gauge pool are used for gauge evaluation from measurement results and/or for gauge measurement, e.g., at 570 for model calibration/verification or at 670 for patterning process monitoring. Therefore, for example, by such selecting gauges from a larger gauge pool, the measurement time is reduced, the simulation time is reduced and/or the accuracy is improved. In an embodiment, the selected gauge pool can comprise 200-10,000 gauges.

But, in this process, gauges of the same gauge pattern (e.g., the gauges 710 and 715 in FIG. 7A and/or the gauges 720 and 725 in FIG. 7B) are considered separately. For example, in FIG. 7A, if the gauge 710 passes the gauge printability check and the gauge 715 fails the gauge printability check, the gauge 710 is considered further for another check, for gauge evaluation from measurement results and/or for gauge measurement, although the gauge pattern in FIG. 7A may not be printed well, as possibly suggested by the failed gauge 715. As a result, gauge 710 may not be effective for use with, e.g., model calibration/verification or process design, control or monitoring.

Accordingly, in an embodiment, a gauge of a gauge pattern is considered for further checking, gauge evaluation from measurement results and/or for gauge measurement only when the gauge under consideration and all the other gauges, if any, of the same gauge pattern, or all of the one or more gauges of the same gauge pattern linked to the gauge under consideration, pass the gauge printability check. Thus, if any gauge of a gauge pattern fails the gauge printability check, all the other gauges, if any, of the same gauge pattern are not considered further. Or, if at least one gauge of the same gauge pattern linked to the gauge under consideration fails the gauge printability check, all of the one or more gauges linked to failed gauge are not considered further.

An example flow diagram illustrating the gauge selection process as described above is shown in FIG. 8. The method conducted in the flow diagram of FIG. 8 may be performed by a software application, a processor, and/or a control module to select gauges for gauge evaluation from measurement results and/or for gauge measurement, in, e.g., one or more inspection tools (such as CD-SEMS). The selected gauges may be used, e.g., at 570 for model calibration/verification and/or at 670 for patterning process monitoring.

At step 800, a plurality of gauges related to the same gauge pattern is identified. In an embodiment, each of the plurality of gauges is linked to each other. In an embodiment, a same gauge pattern has all its gauges linked together. In an embodiment, a gauge pattern comprises a plurality of groups of linked gauges, each group comprising a plurality of linked gauges. In an embodiment, to enable linking, each gauge is associated with a pattern identification (ID), representing the gauge pattern that the gauge relates to. The plurality of gauges corresponding to the same gauge pattern is identified through the same pattern ID.

At step 810, it is determined whether at least one gauge of a gauge pattern fails a gauge printability check or a plurality of gauges of a same gauge pattern passes the gauge printability check (e.g., whether the predicted CD of each gauge calculated using an initial model passes a corresponding CD threshold (i.e., the CD check) and/or whether the ILS of each gauge passes a corresponding ILS threshold (i.e., the ILS check)). Specifically, it is determined whether the gauge under consideration and all the other gauges, if any, of the same gauge pattern, or all of the one or more gauges of the same gauge pattern linked to the gauge under consideration, pass the gauge printability check. If so, the gauges are provided for further checking, gauge evaluation from measurement results and/or for gauge measurement. Thus, if any gauge of a gauge pattern fails the gauge printability check, all the other gauges, if any, of the same gauge pattern are not considered further for further checking, gauge evaluation from measurement results and/or for gauge measurement. Or, if at least one gauge of the same gauge pattern linked to the gauge under consideration fails the gauge printability check, all of the one or more gauges linked to the failed gauge are not considered further for further checking, gauge evaluation from measurement results and/or for gauge measurement.

Thus, in an embodiment, a gauge-linking module is provided to link a gauge of a gauge pattern with one or more other gauges of the same gauge pattern. In an embodiment, the gauge pattern is a two-dimensional pattern (such as a contact/via or a line end). In an embodiment, this module operates before step 810. With the gauge linking, a gauge can only be considered further for further checking, gauge evaluation from measurement results and/or for gauge measurement, if both it and its linked gauges pass the gauge printability check. In an embodiment, the linking comprises linking of pairs of gauge. In an embodiment, the linking comprises linking of three or more gauges.

At step 820, one or more gauges from the gauges remaining from step 810 are selected based on sensitivity to a physical, chemical or optical parameter of the patterning process, such as resist sensitivity and/or optical sensitivity. In an embodiment, one or more measures of the one or more applicable sensitivities are determined by the initial model for the gauges remaining from step 810 and the one or more applicable sensitivities are evaluated to identify one or more gauges passing an applicable threshold (e.g., exceeding a resist sensitivity threshold such that the selected gauges have high resist sensitivity and/or exceeding an optical sensitivity threshold such that the selected gauges have high optical sensitivity). Then the selected gauges are available for gauge evaluation from measurement results and/or for gauge measurement using, e.g., one or more inspection tools. For example, the selected gauges may be used, e.g., at 570 for model calibration/verification or at 670 for patterning process monitoring).

But, gauges pertaining to a same gauge pattern may pass the gauge printability check, including as described above in respect of FIG. 8, even when the gauge pattern is not printed correctly. FIG. 9A depicts an example of problematic gauge patterns. A first gauge pattern has a gauge 950 in the X direction and a gauge 955 in the Y direction. A second gauge pattern has a gauge 940 in the X direction and a gauge 945 in the Y direction. As will be appreciated, there may be further adjacent gauge patterns, one of which is shown. The gauge patterns in FIG. 9A are similar to the gauge pattern in FIG. 7A. But, as shown in FIG. 9B, the contours of the gauge patterns in FIG. 9A can become joined together when the gauge patterns are printed. The existing approach may consider all the gauges 940, 945, 950, and 955 for further checking, gauge evaluation from measurement results and/or for gauge measurement as long as they pass the gauge printability check (which FIG. 9B suggests they would since none of the gauges would be near the joint), although the contours of the first gauge pattern and the second gauge pattern are undesirably joined together as shown in FIG. 9B. Such joining can indicate that the gauge pattern may not be suitable for model calibration/verification, process design, process control or process monitoring. Using measurements of the gauges 940, 945, 950, and/or 955 as an input to, e.g., for model calibration may produce an incorrectly calibrated model.

Accordingly, in an embodiment, gauge pattern printability (as distinct from gauge printability which focuses on points where the imaginary lines of the gauge intersect the shape(s) of the gauge pattern) is evaluated. In an embodiment, the gauge pattern is a two-dimensional pattern (such as a contact/via or a line end). Thus, the gauge pattern printability can be used as a screening filter for complex 2D patterns. The gauge pattern printability can use various detectors (including ILS and CD) to determine gauge pattern printability (as distinct from gauge printability). In an embodiment, the gauge pattern printability is evaluated by using a simulation of the gauge pattern simulated using a mathematical model of at least part of the patterning process. A gauge can be considered further for further checking (e.g., gauge printability), gauge evaluation from measurement results and/or for gauge measurement, when its gauge pattern prints well (e.g., no merging at corners with nearby patterns). In an embodiment, the gauge pattern printability may be implemented using ASML's Tachyon Lithography Manufacturability Check (LMC) tool.

In an embodiment, the gauge pattern printability comprises comparing at least part of a contour shape of a gauge pattern (as the gauge pattern would be printed) to a corresponding at least part the shape of the nominal gauge pattern (i.e., the designed gauge pattern shape) to identify a difference therebetween. When a difference between the at least part of the contour shape of the gauge pattern and the corresponding at least part of the shape of the nominal gauge pattern crosses or remains within an error threshold (e.g., the difference is below an error threshold, the difference falls within an error range, the difference is bounded by an error threshold, etc.), the gauge pattern is considered to be printed well. This process is referred to as a contour shape check and a gauge pattern that is considered to be printed well has passed the contour shape check. Analysis of the difference between the at least part of the contour shape of the gauge pattern and the at least part of the shape of the nominal gauge pattern may include a mathematical transformation to identify a distinction between the contour shape of the gauge pattern and the shape of the nominal gauge pattern, and may include any detectors (e.g., minimum gap distance between adjacent features, gauge pattern area), etc.

Before or after the contour shape check, a gauge printability check as described above may be implemented (whether including the process of step 810 or not). In an embodiment, the contour shape check may be implemented along with the process of step 810 of FIG. 8 before or after the process therein. In an embodiment, the contour shape check and the gauge printability check (whether including the process of step 810 or not) may be combined and referred to as a verification printability check.

Referring now to FIG. 10, schematics of a gauge pattern are depicted. FIG. 10A illustrates a generally elliptical gauge pattern with associated gauges. The gauges correspond to the imaginary lines 1000, 1010 that are superimposed on the contour of the measured shape depicted therein, i.e., the gauge 1000 for CD in the Y direction and the gauge 1010 for CD in the X direction. The gauges are determined at the points (shown by the circles) where the imaginary lines respectively intersect the shape such that the applicable geometric dimensions can be determined. As will be appreciated, thousands of different measurements and/or shapes (whether of the same gauge pattern or not) are made, so there is a variety of shapes present on any substrate that are measured and all of them should be measured well if they are to report values that correspond to what the actual model would like to have as far as information corresponding to the gauge positions.

Figure 10A:
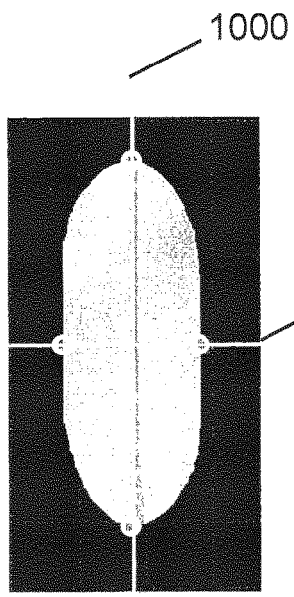
FIG. 10A schematically depicts a gauge pattern and FIGS. 10B, 10C, 10D, 10E and 10F schematically depict the nature of various algorithms to determine a gauge for the gauge pattern.
Figure 10B:
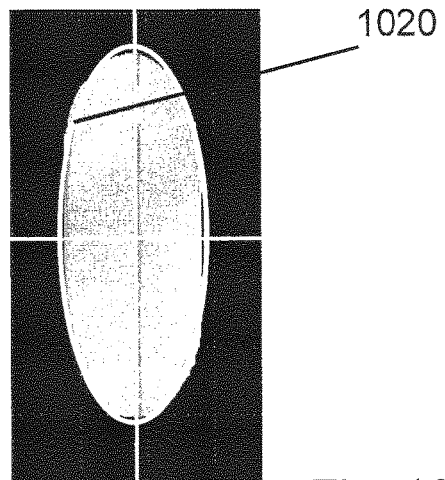
Figure 10C:
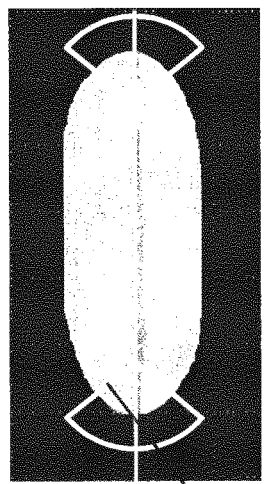
Figure 10D:
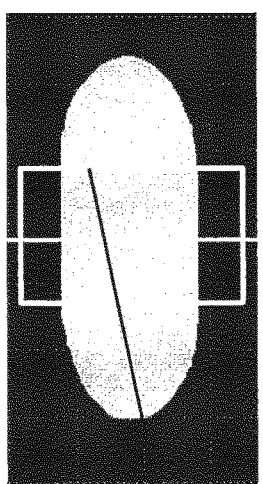
Figure 10E:
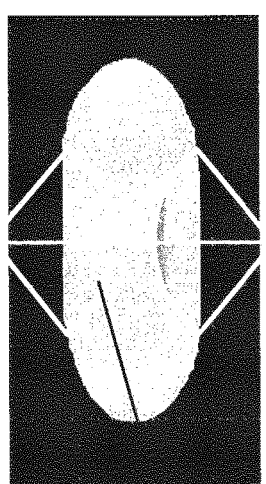
Figure 10F:
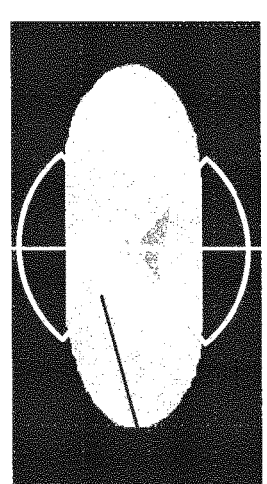

So, ideally, the measurements that are made using an inspection tool (e.g., a CD-SEM) would correspond exactly to those crossing points. But, in practice, that may not be the case. Rather, when one configures measurements for these kinds of shapes using an inspection tool (e.g., a CD-SEM), the inspection tool is configured in a way that requires some choices of measurement algorithms. Referring then to FIGS. 10B-10F, examples of some of the types of algorithms that are typically used to measure these kinds of shapes are depicted. So, referring to FIG. 10B, the inspection tool (e.g., a CD-SEM) might be configured to report the dimensions corresponding to an ellipse fit 1020 to the shape. But, as seen in FIG. 10B, the ellipse fit might not be a particularly good choice in the example shape shown in FIG. 10B. FIG. 10C depicts another example of algorithm that involves sweeping parts of the shape. FIG. 10C depicts an example of an arc sweep in the Y-direction algorithm 1030. This algorithm basically sweeps the tips of the shape and estimates what the actual gauge dimension is based on a fit to that sweep. FIG. 10D depicts a further algorithm 1040 by which parts of the shape can be measured by basically performing a width base measurement (in this case in FIG. 10D, in the X-direction). This is more or less an averaging box by which an average along the length of the shape is determined. The average is used and reported as a measurement that could be used to associate with the desired gauge measurement. Then, FIGS. 10E and 10F depict example of an arc sweep in the X-direction algorithm 1060. This algorithm basically angularly sweeps the sides of the shape and estimates what the actual gauge dimension is based on a fit to that sweep. Further, these different measurement algorithm choices can be combined in different ways in the configuration of the way that the inspection tool (e.g., a CD-SEM) is run, e.g., width in the X or Y direction plus arc sweep in the X or Y direction, or width in the X-direction plus width in the Y-direction, or arc sweep in the Y-direction plus arc sweep in the X-direction.

So, essentially all measurements that are made using an inspection tool (e.g., a CD-SEM) are specified to be made using a certain algorithm or a certain set of algorithms. So, the inspection tool (e.g., the CD-SEM) receives measurement algorithm specifications ahead of time regarding how it should measure any given image that it captures and how it should then use that measurement methodology to report a result. This may turn out to be problematic.

The shapes that are being measured may not correspond exactly to any particular algorithm that is used to attempt to measure them. That is, some shapes are not particularly well measured by particular algorithms. Nevertheless, one or more measurement algorithms are chosen that are predicted to measure the given shape well and, at the end of the measurement, the inspection tool (e.g., the CD-SEM) will report as requested even though the prediction for a measurement algorithm may not have been perfect. As a result, a large portion of the data may not be measured correctly for model calibration/verification, process control, etc.

For example, some gauge patterns may be slot-like or ellipse-like, but not really either one. So, for example, if the curvature at the end of the shape is not necessarily well defined, if it is more box-like as opposed to being more rounded then perhaps an arc sweep algorithm may misfit that shape. As another example, for the width in the X-direction algorithm, if there is some curvature in the side of the shape that is being measured that will distort the average value that is ultimately reported. The result is that choice of an algorithm creates algorithm dependent offsets in the data. So, for example, if shapes are ellipse-like they should desirably be measured using an ellipse algorithm. And, for example, if shapes are slot-like, then they should probably be measured as a combination of a width algorithm and an arc sweep type algorithm. But there are many shapes where it is not known, and cannot be known, at the time of measurement which algorithm is appropriate because the shapes are neither an ellipse nor a slot but rather some intermediate shape. Nevertheless, an algorithm choice is made up front and the measurement offset between the measurement methodologies can be quite significant for any particular shape that is neither perfectly an ellipse nor a slot. For example, there may be a 5 percent (as fraction of measured CD) or larger difference in terms of measuring any of those intermediate shapes as an ellipse versus as a width measurement. So essentially for any intermediate shape, there will be a bouncing back and forth between measuring using a particular algorithm(s) and measuring using another algorithm(s) that inherently creates an algorithm induced jitter in the quality of the measurement data.

Accordingly, in an embodiment, in attempt to resolve this in relation to gauges, at least part of the shapes of the gauge pattern associated with gauges can be evaluated to find a suitable measurement algorithm (e.g., a suitable CD SEM measurement) for different gauge pattern shapes and those that have a suitable measurement algorithm can be considered metrology-friendly patterns. The user or system can choose to consider, measure, etc. only the metrology-friendly patterns. In an embodiment, the gauge patterns are two-dimensional patterns (such as a contact/via or a line end). Thus, in an embodiment, shapes of complex 2D patterns can be predicted, which can be used to find an optimal measurement algorithms (e.g., CD SEM recipes) for different shapes. It can also then be used to identify shapes which have no optimal measurement algorithm. The user or system can then choose to measure only those metrology-friendly patterns. In this way, a metrology-friendly filter may be provided.

In an embodiment, to enable the metrology-friendly filter, at least part of a contour shape of a gauge pattern is compared with the predetermined shapes for which one or more measurement algorithms of the inspection tool (e.g., a CD-SEM) are designed to measure. In an embodiment, the contour shape is determined by simulation using a mathematical model of at least part of the patterning process. When a difference between the at least part of the contour shape of the gauge pattern and one of the predetermined shapes crosses or remains within a threshold (e.g., the difference is below an error threshold, the difference falls within an error range, the difference is bounded by an error threshold, etc.), the gauge pattern is considered suited for the one or more measurement algorithms associated with the predetermined shape. This process is referred to as a metrology friendliness check. As an example, an algorithm may be designed to measure an ellipse as distinct from a slot/box. Accordingly, the contour shape of a gauge pattern can be evaluated against the respective algorithms to identify whether the gauge pattern can be measured well. So, for example, the short axis, long axis and/or printing area of the gauge pattern can be evaluated against the shapes of the algorithms to determine whether the algorithms would measure the gauge pattern well or not. So, if one or more of the short axis, long axis and/or printing area is more than, for example, 90%, 95%, 98% or 99% of an ellipse or a slot/box then it can be measured well by an algorithm designed respectively for an ellipse or a slot/box. So, if the metrology tool is setup for, e.g., an algorithm designed to measure ellipses, the gauge patterns that don't meet the criteria for measurement by an algorithm designed to measure ellipses may be not measured, may not be evaluated from measurement results, etc.

Thus, a gauge pattern that passes the metrology friendliness check is referred to as a metrology-friendly pattern. The gauges of the metrology-friendly pattern are expected to be measured accurately by an inspection tool (e.g., a CD-SEM) using one or more measurement algorithms. Otherwise, the metrology friendliness check fails and, as a result, none of the gauges pertaining to the gauge pattern are considered for suitable for measurement, for evaluation from measurement results, etc.

In an embodiment, based on the metrology friendliness check, an identifier may be provided to the gauge patterns that identify which measurement algorithm is best suited for the respective gauge patterns. This may be useful if the metrology apparatus can switch algorithms prior to or during measurement of gauge patterns.

So, in an embodiment, after the metrology friendliness check, the inspection tool (e.g., a CD-SEM) measures gauges of the metrology-friendly patterns on the actual substrate. Or, in an embodiment, after the metrology friendliness check, gauges are evaluated in model calibration/verification, process control, etc. for those patterns measured by an inspection tool (e.g., a CD-SEM) that are metrology-friendly patterns. Through the use of the metrology friendliness check, the amount of data measured that is not accurate is reduced and/or measured data of low accuracy is not used. In an embodiment, the metrology-friendliness check may be implemented using ASML's Tachyon Lithography Manufacturability Check (LMC) tool.

Figure 11:
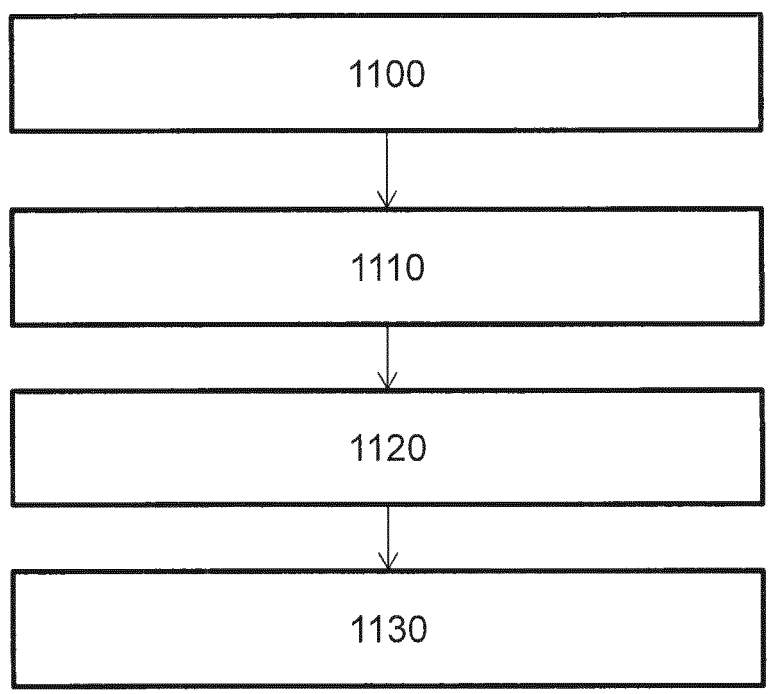
FIG. 11 is a flow diagram illustrating an embodiment of a method of gauge selection.

An example gauge selection process as discussed above is illustrated in FIG. 11. The example gauge selection process may be implemented by a software application, a processor or a control module to select gauges for measurement or for use after measurement, in order to calibrate or verify a model (e.g., an OPC model), monitor a patterning process, design a patterning process, etc.

The process begins by obtaining an image of a gauge pattern and one or more gauges pertaining to the gauge pattern at 1100. One or more parameters indicating the printability (e.g., CD, ILS, etc.) of the one or more gauges may be determined based on the image. Additionally or alternatively, a contour of one or more shapes within the image may be determined based on the image. At 1110, a verification printability check is performed on the one or more gauges. Specifically, the verification printability check comprises the gauge printability check and/or the contour shape check. Where the gauge printability check and the contour shape check are performed, their order is interchangeable.

Where the verification printability check comprises either the gauge printability check or the contour shape check, a gauge of the gauge pattern passes the verification printability check when the gauge passes the applicable gauge printability check or contour shape check. Where the verification printability check comprises the gauge printability check and the contour shape check, a gauge of the gauge pattern passes the verification printability check when the gauge passes both the gauge printability check and the contour shape check. All the gauges of the gauge pattern that pass the verification printability check are considered for further evaluation, for measurement, for evaluation from measurement results, etc. The process proceeds to step 1120. Otherwise, if none of the gauges pertaining to the gauge pattern pass the verification printability check, then the process is finished as none of the gauges are considered ready for measurement, evaluation after measurement, etc.

At step 1120, one or more gauges that passed the verification printability check are evaluated for sensitivity to a physical, chemical or optical parameter of the patterning process, such as resist sensitivity and/or optical sensitivity. Then, one or more gauges are selected based on the one or more sensitivities.

At step 1130, a metrology friendliness check is performed on the one or more gauges from step 1120. The metrology friendliness check determines whether a difference between at least part of the contour shape of the one or more gauge patterns pertaining to the one or more gauges and one of the predetermined shapes that the inspection tool (e.g., a CD-SEM) measures crosses or remains within a threshold (e.g., (e.g., the difference is below an error threshold, the difference falls within an error range, the difference is bounded by an error threshold, etc.). If so, the gauges of the applicable one or more gauge patterns that pass the metrology friendliness check are selected for measurement by an inspection tool (e.g., a CD-SEM), for evaluation after measurement, etc. Otherwise, if all the one or more gauge patterns fail the metrology friendliness check, then the process is finished as none of the gauges are considered ready for measurement, evaluation after measurement, etc.

In an embodiment, the order of implementing step 1110 and step 1130 are interchangeable. In an embodiment, step 1130 is performed but step 1110 is not performed. In an embodiment, step 1110 is performed but step 1130 is not performed.

In an embodiment, steps 1110 and 1130 are combined. The combined step may be implemented before or after step 1120. Further, in the combined step, the contour shape check and the metrology friendliness check may be both implemented by ASML's Tachyon LMC tool.

Once gauges and one or more associated gauge patterns are selected and measured, the measurement information can be used in model calibration/verification, in process design, in process control, in process monitoring, etc. In an embodiment, image data of the gauge pattern can be used (in addition to or alternatively to a gauge). For example, a SEM (e.g., CD SEM) image can be used in, for example, model calibration or verification. For example, the model may generate information similar to a SEM image of the gauge pattern in, for example, simulation and so the model output can be compared with the measured SEM image. Similarly, an extracted contour of the gauge pattern from measurements (e.g., SEM measurement such as a CD-SEM measurement) can be used in, for example, model calibration or verification. For example, the model may generate information the same as or similar to an extracted contour of a measurement of the gauge pattern (such as an extracted contour from a SEM image) in, for example, simulation and so the model output can be compared with the extracted contour of a measurement of the gauge pattern (e.g., an extracted contour from a SEM image).

In an embodiment, there is provided a method comprising: obtaining a plurality of gauges of a plurality of gauge patterns for a patterning process, each gauge pattern configured for measurement of a parameter of the patterning process when created as part of the patterning process; and creating a selection of one or more gauges from the plurality of gauges, wherein a gauge is included in the selection provided the gauge and all the other gauges, if any, of the same gauge pattern, or all of the one or more gauges of the same gauge pattern linked to the gauge, pass a gauge printability check.

In an embodiment, a gauge is included in the selection provided all of the one or more gauges of the same gauge pattern linked to the gauge, pass the gauge printability check and wherein a plurality of gauges of the same gauge pattern are linked by being associated with a same gauge pattern identification. In an embodiment, the method further comprises performing a contour shape check to identify whether a gauge pattern is considered to be printed well and a gauge is included in the selection provided its gauge pattern is considered to be printed well. In an embodiment, the method further comprises determining a gauge is metrology friendly by evaluating its gauge pattern against a predetermined shape for which a measurement algorithm of an inspection tool is designed to measure and the gauge is included in the selection provided it is metrology friendly. In an embodiment, the gauge printability check comprises determining whether an image log slope and/or critical dimension pertaining to the one or more gauges pass a threshold. In an embodiment, the gauge printability check comprises obtaining a value of a printability parameter relating to the one or more gauges by simulation using a mathematical model representing at least part of the patterning process. In an embodiment, the method further comprises selecting one or more gauges from the selection based on sensitivity of the one or more gauges to a physical, chemical or optical parameter of the patterning process. In an embodiment, the selecting based on sensitivity comprises selected based on whether a resist and/or optical sensitivity of the one or more gauges crosses or remains within a threshold. In an embodiment, the method further comprises using measurement of the one or more gauges to calibrate or verify a mathematical model representing at least part of the patterning process. In an embodiment, the method further comprises using measurement of the one or more gauges to control or monitor the patterning process. In an embodiment, the gauge pattern comprises a feature of an integrated circuit pattern. In an embodiment, the method further comprises using information obtained by, and/or information derived from, a measurement of the one or more gauges to calibrate or verify a mathematical model representing at least part of the patterning process. In an embodiment, using information obtained by, and/or information derived from, the measurement of the one or more gauges to calibrate or verify the mathematical model comprises using a SEM image and/or a contour derived from SEM data to calibrate or verify the mathematical model representing at least part of the patterning process.

In an embodiment, there is provided a method comprising: obtaining a plurality of gauges of a plurality of gauge patterns for a patterning process, each gauge pattern configured for measurement of a parameter of the patterning process when created as part of the patterning process; and creating a selection of one or more gauges from the plurality of gauges, wherein a gauge is included in the selection provided that its gauge pattern is considered to be printed well based on evaluation of the printability of the gauge pattern.

In an embodiment, the gauge is considered to be printed well based on a determination that a difference between at least part of a contour shape of its gauge pattern and a corresponding at least part of a shape of its nominal gauge pattern crosses a threshold. In an embodiment, a gauge is included in the selection provided the gauge and all the other gauges, if any, of the same gauge pattern, or all of the one or more gauges of the same gauge pattern linked to the gauge, pass a gauge printability check. In an embodiment, the method further comprises determining whether a gauge is metrology friendly by evaluating the gauge pattern of the gauge against a predetermined shape for which a measurement algorithm of an inspection tool is designed to measure and the gauge is included in the selection provided it is metrology friendly. In an embodiment, evaluating the gauge pattern comprises determining whether a difference between a shape of a contour pertaining to the gauge pattern and the predetermined shape for which the measurement algorithm of the inspection tool is designed to measure crosses or remains within a threshold. In an embodiment, the contour shape is obtained by simulation using a mathematical model representing at least part of the patterning process. In an embodiment, the method further comprises selecting one or more gauges from the selection based on sensitivity of the one or more gauges to a physical, chemical or optical parameter of the patterning process. In an embodiment, the selecting based on sensitivity comprises selected based on whether a resist and/or optical sensitivity of the one or more gauges crosses or remains within a threshold. In an embodiment, the method further comprises using measurement of the one or more gauges to calibrate or verify a mathematical model representing at least part of the patterning process. In an embodiment, the method further comprises using measurement of the one or more gauges to control or monitor the patterning process. In an embodiment, the gauge pattern comprises a feature of an integrated circuit pattern. In an embodiment, the method further comprises using information obtained by, and/or information derived from, a measurement of the one or more gauges to calibrate or verify a mathematical model representing at least part of the patterning process. In an embodiment, using information obtained by, and/or information derived from, the measurement of the one or more gauges to calibrate or verify the mathematical model comprises using a SEM image and/or a contour derived from SEM data to calibrate or verify the mathematical model representing at least part of the patterning process.

In an embodiment, there is provided a method comprising: obtaining a plurality of gauges of one or more gauge patterns for a patterning process, the one or more gauge patterns each configured for measurement of a parameter of the patterning process when created as part of the patterning process; and creating a selection of one or more gauges from the plurality of gauges, wherein a gauge is included in the selection provided that it is metrology friendly responsive to evaluation of the gauge pattern of the gauge against a predetermined shape for which a measurement algorithm of an inspection tool is designed to measure.

In an embodiment, evaluation of the gauge pattern comprises determining whether a difference between a shape of a contour pertaining to the gauge pattern and the predetermined shape for which the measurement algorithm of the inspection tool is designed to measure, crosses or remains within a threshold. In an embodiment, the inspection tool is a scanning electron microscope. In an embodiment, the method further comprises performing a contour shape check to identify whether a gauge pattern is considered to be printed well and a gauge is included in the selection provided its gauge pattern is considered to be printed well. In an embodiment, a gauge is included in the selection provided the gauge and all the other gauges, if any, of the same gauge pattern, or all of the one or more gauges of the same gauge pattern linked to the gauge, pass a gauge printability check. In an embodiment, the evaluated gauge pattern is obtained by simulation using a mathematical model representing at least part of the patterning process. In an embodiment, the method further comprises selecting one or more gauges from the selection based on sensitivity of the one or more gauges to a physical, chemical or optical parameter of the patterning process. In an embodiment, the selecting based on sensitivity comprises selected based on whether a resist and/or optical sensitivity of the one or more gauges crosses or remains within a threshold. In an embodiment, the method further comprises using measurement of the one or more gauges to calibrate or verify a mathematical model representing at least part of the patterning process. In an embodiment, the method further comprises using measurement of the one or more gauges to control or monitor the patterning process. In an embodiment, the gauge pattern comprises a feature of an integrated circuit pattern. In an embodiment, the method further comprises using information obtained by, and/or information derived from, a measurement of the one or more gauges to calibrate or verify a mathematical model representing at least part of the patterning process. In an embodiment, using information obtained by, and/or information derived from, the measurement of the one or more gauges to calibrate or verify the mathematical model comprises using a SEM image and/or a contour derived from SEM data to calibrate or verify the mathematical model representing at least part of the patterning process.

In association with an imaging apparatus such as a SEM, an embodiment may include a computer program containing one or more sequences of machine-readable instructions describing a method of detecting and representing an imaged structure, registering a template image object representing the imaged structure against a reference image object, and/or predicting a change in a structure based on variation in a parameter during a patterning process. This computer program may be included, for example, with or within the imaging apparatus of FIG. 3 and/or with or within the control unit LACU of FIG. 2. There may also be provided a data storage medium (e.g., semiconductor memory, magnetic or optical disk) having such a computer program stored therein. Where an existing apparatus, for example of the type shown in FIGS. 1-3, is already in production and/or in use, an embodiment can be implemented by the provision of updated computer program products for causing a processor of the apparatus to perform a method as described herein.

The term "optimizing" and "optimization" as used herein mean adjusting an apparatus or process, e.g., a lithographic apparatus or an optical lithography process step, such that patterning and/or device fabrication results and/or processes (e.g., of lithography) have one or more desirable characteristics, such as higher accuracy of projection of a design layout on a substrate, larger process window, etc.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after pattern transfer, in for example a track (a tool that typically applies a layer of resist to a substrate and develops the patterned resist), an inspection tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The invention may further be described using the following clauses:

1. A method comprising:
   obtaining a plurality of gauges of a plurality of gauge patterns for a patterning process, each gauge pattern configured for measurement of a parameter of the patterning process when created as part of the patterning process; and
   creating a selection of one or more gauges from the plurality of gauges, wherein a gauge is included in the selection provided the gauge and all the other gauges, if any, of the same gauge pattern, or all of the one or more gauges of the same gauge pattern linked to the gauge, pass a gauge printability check.
2. The method of clause 1, wherein a gauge is included in the selection provided all of the one or more gauges of the same gauge pattern linked to the gauge, pass the gauge printability check and wherein a plurality of gauges of the same gauge pattern are linked by being associated with a same gauge pattern identification.
3. The method of clause 1 or clause 2, further comprising performing a contour shape check to identify whether a gauge pattern is considered to be printed well and a gauge is included in the selection provided its gauge pattern is considered to be printed well.
4. The method of any of clauses 1 to 3, further comprising determining a gauge is metrology friendly by evaluating its gauge pattern against a predetermined shape for which a measurement algorithm of an inspection tool is designed to measure and the gauge is included in the selection provided it is metrology friendly.
5. The method of any of clauses 1 to 4, wherein the gauge printability check comprises determining whether an image log slope and/or critical dimension pertaining to the one or more gauges pass a threshold.
6. The method of any of clauses 1 to 5, wherein the gauge printability check comprises obtaining a value of a printability parameter relating to the one or more gauges by simulation using a mathematical model representing at least part of the patterning process.
7. The method of any of clauses 1 to 6, further comprising selecting one or more gauges from the selection based on sensitivity of the one or more gauges to a physical, chemical or optical parameter of the patterning process.
8. The method of clause 7, wherein the selecting based on sensitivity comprises selected based on whether a resist and/or optical sensitivity of the one or more gauges crosses or remains within a threshold.
9. The method of any of clauses 1 to 8, further comprising using information obtained by, and/or information derived from, a measurement of the one or more gauges to calibrate or verify a mathematical model representing at least part of the patterning process.
10. The method of clause 9, wherein using information obtained by, and/or information derived from, the measurement of the one or more gauges to calibrate or verify the mathematical model comprises using a SEM image and/or a contour derived from SEM data to calibrate or verify the mathematical model representing at least part of the patterning process.
11. The method of any of clauses 1 to 10, further comprising using measurement of the one or more gauges to control or monitor the patterning process.
12. The method of any of clauses 1 to 11, wherein the gauge pattern comprises a feature of an integrated circuit pattern.
13. A method comprising:
   obtaining a plurality of gauges of a plurality of gauge patterns for a patterning process, each gauge pattern configured for measurement of a parameter of the patterning process when created as part of the patterning process; and
   creating a selection of one or more gauges from the plurality of gauges, wherein a gauge is included in the selection provided that its gauge pattern is considered to be printed well based on evaluation of the printability of the gauge pattern.
14. The method of clause 13, wherein the gauge is considered to be printed well based on a determination that a difference between at least part of a contour shape of its gauge pattern and a corresponding at least part of a shape of its nominal gauge pattern crosses a threshold.
15. The method of clause 13 or clause 14, wherein a gauge is included in the selection provided the gauge and all the other gauges, if any, of the same gauge pattern, or all of the one or more gauges of the same gauge pattern linked to the gauge, pass a gauge printability check.
16. The method of any of clauses 13 to 15, further comprising determining whether a gauge is metrology friendly by evaluating the gauge pattern of the gauge against a predetermined shape for which a measurement algorithm of an inspection tool is designed to measure and the gauge is included in the selection provided it is metrology friendly.
17. The method of clause 16, wherein evaluating the gauge pattern comprises determining whether a difference between a shape of a contour pertaining to the gauge pattern and the predetermined shape for which the measurement algorithm of the inspection tool is designed to measure crosses or remains within a threshold.
18. The method of any of clauses 13 to 17, wherein the contour shape is obtained by simulation using a mathematical model representing at least part of the patterning process.
19. The method of any of clauses 13 to 18, further comprising selecting one or more gauges from the selection based on sensitivity of the one or more gauges to a physical, chemical or optical parameter of the patterning process.

20. The method of clause 19, wherein the selecting based on sensitivity comprises selected based on whether a resist and/or optical sensitivity of the one or more gauges passes a threshold.

21. The method of any of clauses 13 to 20, further comprising using information obtained by, and/or information derived from, a measurement of the one or more gauges to calibrate or verify a mathematical model representing at least part of the patterning process.

22. The method of clause 21, wherein using information obtained by, and/or information derived from, the measurement of the one or more gauges to calibrate or verify the mathematical model comprises using a SEM image and/or a contour derived from SEM data to calibrate or verify the mathematical model representing at least part of the patterning process.

23. The method of any of clauses 13 to 22, further comprising using measurement of the one or more gauges to control or monitor the patterning process.

24. The method of any of clauses 13 to 23, wherein the gauge pattern comprises a feature of an integrated circuit pattern.

25. A method comprising:
obtaining a plurality of gauges of one or more gauge patterns for a patterning process, the one or more gauge patterns each configured for measurement of a parameter of the patterning process when created as part of the patterning process; and
creating a selection of one or more gauges from the plurality of gauges, wherein a gauge is included in the selection provided that it is metrology friendly responsive to evaluation of the gauge pattern of the gauge against a predetermined shape for which a measurement algorithm of an inspection tool is designed to measure.

26. The method of clause 25, wherein evaluation of the gauge pattern comprises determining whether a difference between a shape of a contour pertaining to the gauge pattern and the predetermined shape for which the measurement algorithm of the inspection tool is designed to measure, crosses or remains within a threshold.

27. The method of clause 25 or clause 26, wherein the inspection tool is a scanning electron microscope.

28. The method of any of clauses 25 to 27, further comprising performing a contour shape check to identify whether a gauge pattern is considered to be printed well and a gauge is included in the selection provided its gauge pattern is considered to be printed well.

29. The method of any of clauses 25 to 28, wherein a gauge is included in the selection provided the gauge and all the other gauges, if any, of the same gauge pattern, or all of the one or more gauges of the same gauge pattern linked to the gauge, pass a gauge printability check.

30. The method of any of clauses 25 to 29, wherein the evaluated gauge pattern is obtained by simulation using a mathematical model representing at least part of the patterning process.

31. The method of any of clauses 25 to 30, further comprising selecting one or more gauges from the selection based on sensitivity of the one or more gauges to a physical, chemical or optical parameter of the patterning process.

32. The method of clause 31, wherein the selecting based on sensitivity comprises selected based on whether a resist and/or optical sensitivity of the one or more gauges passes a threshold.

33. The method of any of clauses 25 to 32, further comprising using information obtained by, and/or information derived from, a measurement of the one or more gauges to calibrate or verify a mathematical model representing at least part of the patterning process.

34. The method of clause 33, wherein using information obtained by, and/or information derived from, the measurement of the one or more gauges to calibrate or verify the mathematical model comprises using a SEM image and/or a contour derived from SEM data to calibrate or verify the mathematical model representing at least part of the patterning process.

35. The method of any of clauses 25 to 34, further comprising using measurement of the one or more gauges to control or monitor the patterning process.

36. The method of any of clauses 25 to 35, wherein the gauge pattern comprises a feature of an integrated circuit pattern.

37. A method of manufacturing devices wherein a device pattern is applied to a series of substrates using a patterning process, the method including performing the method of any of clauses 1 to 36 and controlling and/or designing the patterning process for one or more of the substrates in accordance with the one or more gauges of the method.

38. A non-transitory computer program product comprising machine-readable instructions configured to cause a processor to cause performance of the method of any of clauses 1 to 37.

39. A system comprising:
a scanning electron microscope configured to provide an image of a lithographically created structure; and
an image analysis engine comprising the non-transitory computer program product of clause 38.

40. The system of clause 39, further comprising a lithographic apparatus comprising a support structure configured to hold a patterning device to modulate a radiation beam and a projection optical system arranged to project the modulated onto a radiation-sensitive substrate.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:
1. A method comprising:
obtaining a plurality of gauges of a plurality of gauge patterns for a patterning process, each gauge pattern configured for measurement of a parameter of the patterning process when created as part of the patterning process; and
creating, by a hardware computer system, a selection of one or more gauges from the plurality of gauges, wherein a gauge is included in the selection provided the gauge and all the other gauges, if any, of the same gauge pattern, or all of the one or more gauges of the same gauge pattern linked to the gauge, pass a gauge printability check.

2. The method of claim 1, wherein a gauge is included in the selection provided all of the one or more gauges of the same gauge pattern linked to the gauge, pass the gauge printability check and wherein a plurality of gauges of the same gauge pattern are linked by being associated with a same gauge pattern identification.

3. The method of claim 1, further comprising performing a contour shape check to identify whether a gauge pattern is considered to be printed well and a gauge is included in the selection provided its gauge pattern is considered to be printed well.

4. The method of claim 1, further comprising determining a gauge is metrology friendly by evaluating its gauge pattern against a predetermined shape for which a measurement algorithm of an inspection tool is designed to measure and the gauge is included in the selection provided it is metrology friendly.

5. The method of claim 1, wherein the gauge printability check comprises determining whether an image log slope and/or critical dimension pertaining to a gauge passes a threshold.

6. The method of claim 1, wherein the gauge printability check comprises obtaining a value of a printability parameter relating to a gauge by simulation using a mathematical model representing at least part of the patterning process.

7. The method of claim 1, further comprising selecting one or more gauges from the selection based on sensitivity of a gauge to a physical, chemical or optical parameter of the patterning process.

8. The method of claim 7, wherein the selecting based on sensitivity comprises selecting based on whether a resist and/or optical sensitivity of a gauge crosses or remains within a threshold.

9. The method of claim 1, further comprising using information obtained by, and/or information derived from, a measurement of the one or more gauges of the selection to calibrate or verify a mathematical model representing at least part of the patterning process.

10. The method of claim 9, wherein using information obtained by, and/or information derived from, the measurement of the one or more gauges of the selection to calibrate or verify the mathematical model comprises using a SEM image and/or a contour derived from SEM data to calibrate or verify the mathematical model representing at least part of the patterning process.

11. The method of claim 1, further comprising using measurement of the one or more gauges of the selection to control or monitor the patterning process.

12. The method of claim 1, wherein the gauge pattern comprises a feature of an integrated circuit pattern.

13. A method comprising:
obtaining a plurality of gauges of a plurality of gauge patterns for a patterning process, each gauge pattern configured for measurement of a parameter of the patterning process when created as part of the patterning process; and
creating, by a hardware computer system, a selection of one or more gauges from the plurality of gauges, wherein a gauge is included in the selection provided that its gauge pattern is considered to be printed well based on evaluation of the printability of the gauge pattern.

14. The method of claim 13, wherein the gauge is considered to be printed well based on a determination that a difference between at least part of a contour shape of its gauge pattern and a corresponding at least part of a shape of its nominal gauge pattern crosses a threshold.

15. The method of claim 13, further comprising determining whether a gauge is metrology friendly by evaluating the gauge pattern of the gauge against a predetermined shape for which a measurement algorithm of an inspection tool is designed to measure and the gauge is included in the selection provided it is metrology friendly.

16. The method of claim 13, comprising evaluating the printability of the pattern by determining whether a difference between a shape of a contour pertaining to the gauge pattern and a predetermined shape for which the measurement algorithm of the inspection tool is designed to measure crosses or remains within a threshold.

17. The method of claim 13, further comprising selecting one or more gauges from the selection based on sensitivity of a gauge to a physical, chemical or optical parameter of the patterning process.

18. The method of claim 13, further comprising using information obtained by, and/or information derived from, a measurement of the one or more gauges of the selection to calibrate or verify a mathematical model representing at least part of the patterning process.

19. A non-transitory computer program product comprising machine-readable instructions, when executed, configured to cause a processor system to at least:
obtain a plurality of gauges of a plurality of gauge patterns for a patterning process, each gauge pattern configured for measurement of a parameter of the patterning process when created as part of the patterning process; and
create a selection of one or more gauges from the plurality of gauges, wherein a gauge is included in the selection provided the gauge and all the other gauges, if any, of the same gauge pattern, or all of the one or more gauges of the same gauge pattern linked to the gauge, pass a gauge printability check.

20. A system comprising:
a scanning electron microscope configured to provide an image of a lithographically created structure; and
an image analysis engine comprising the non-transitory computer program product of claim 19.

21. A non-transitory computer program product comprising machine-readable instructions, when executed configured to cause a processor system to at least:
obtain a plurality of gauges of a plurality of gauge patterns for a patterning process, each gauge pattern configured for measurement of a parameter of the patterning process when created as part of the patterning process; and
create a selection of one or more gauges from the plurality of gauges, wherein a gauge is included in the selection provided that its gauge pattern is considered to be printed well based on evaluation of the printability of the gauge pattern.

* * * * *